United States Patent
Kimura et al.

(10) Patent No.: US 8,031,015 B2
(45) Date of Patent: Oct. 4, 2011

(54) PHASE-LOCKED LOOP CIRCUIT

(75) Inventors: Syuji Kimura, Gunma (JP); Takashi Hashizume, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 564 days.

(21) Appl. No.: 10/590,644

(22) PCT Filed: Feb. 14, 2005

(86) PCT No.: PCT/JP2005/002156
§ 371 (c)(1),
(2), (4) Date: Jul. 25, 2008

(87) PCT Pub. No.: WO2005/083887
PCT Pub. Date: Sep. 9, 2005

(65) Prior Publication Data
US 2008/0278248 A1  Nov. 13, 2008

(30) Foreign Application Priority Data
Feb. 27, 2004  (JP) .................................. 2004-055280

(51) Int. Cl.
*H03B 29/00* (2006.01)
(52) U.S. Cl. .............. 331/78; 331/16; 331/175; 331/34; 331/1 A; 331/25; 332/127; 327/156
(58) Field of Classification Search .............. 331/16, 331/175, 34, 1 A, 25, 78; 332/127
See application file for complete search history.

(56) References Cited

U.S. PATENT DOCUMENTS

| | | | | |
|---|---|---|---|---|
| 4,937,536 A | * | 6/1990 | Reinhardt et al. | ............... 331/8 |
| 5,903,197 A | | 5/1999 | Kikugawa | |
| 6,157,271 A | * | 12/2000 | Black et al. | ................ 332/127 |

FOREIGN PATENT DOCUMENTS

| | | |
|---|---|---|
| CN | 1203483 | 12/1998 |
| JP | 2000-101424 | 4/2000 |
| JP | 2000-252817 | 9/2000 |
| JP | 2001-07700 | 1/2001 |

* cited by examiner

*Primary Examiner* — Arnold Kinkead
(74) *Attorney, Agent, or Firm* — SoCal IP Law Group LLP; Steven C. Sereboff; John E. Gunther

(57) ABSTRACT

A PLL circuit is disclosed that comprises a controlling unit that switches at a predetermined timing to enable/disable the phase difference signal supplied from the phase comparator to the low pass filter; and a resistor element that is disposed between a predetermined potential and a signal line for supplying the phase difference signal from the phase comparator to the low pass filter, when the phase difference signal is enabled, the oscillation circuit performing oscillation operation based on the voltage signal corresponding to the phase difference signal, when the phase difference signal is disabled, the low pass filter being supplied with the predetermined potential through the resistor element to allow the oscillation circuit to perform oscillation operation based on the voltage signal generated depending on the supplied predetermined potential.

5 Claims, 6 Drawing Sheets

US 8,031,015 B2

PHASE-LOCKED LOOP CIRCUIT

CROSS-REFERENCE TO RELATED APPLICATIONS

This application is a National Stage Application filed under 35 U.S.C. §371 and claims the benefit of priority to International Patent Application PCT/JP2005/2156, filed Feb. 14, 2005, which claims priority to Japanese Patent Application No. 2004-055280, filed Feb. 27, 2004. The full contents of the international application are incorporated herein by reference.

BACKGROUND OF THE INVENTION

1. Technical Field

The present invention relates to a PLL circuit that employs a spread spectrum technology.

2. Description of the Related Art

Recently, in electronic devices, speeding-up of a signal process and high-density packaging are promoted and it is an important issue to reduce EMI (Electro Magnetic Interference) noise. EMI is an electromagnetic failure causing a malfunction due to radiation noise generated by the electronic devices. The EMI noise is known to be caused mainly by a system clock signal generated by a voltage controlled oscillation circuit (VCO) of a PLL (Phase Locked Loop) circuit. That is, by performing the switching operation in an electronic device at high speed based on the system clock signal with a generally high frequency, the switching noise, i.e., the EMI noise is generated.

Therefore, a so-called spread spectrum technology attracts attention, such as modulating the frequency of the system clock signal to attenuate or spread a peak level of a power spectrum correlated with the frequency of the system clock signal. The power spectrum is a level (power) of each signal frequency component appearing on a time axis, which is represented with a frequency axis versus a power axis.

FIG. 6 shows a configuration of a PLL circuit that employs a conventional spread spectrum technology (e.g., Japanese Patent Application Laid-Open Publication No. 2001-7700).

A conventional PLL circuit includes a reference frequency divider 610, a voltage controlled oscillator (hereinafter, VCO) 620, a comparison frequency dividers 630, 631, a selector 632, a phase comparator 640, a charge pump 650, and a low-pass filter (hereinafter, LPF) 660.

The reference frequency divider 610 is a frequency divider that divides a frequency of an oscillation clock signal generated by a predetermined oscillation circuit to supply the phase comparator 640 with a reference signal fr. The VCO 620 controls an oscillation frequency depending on an applied voltage. An oscillation output fo of the VCO 620 is normally used as a system clock signal of an electronic device with a PLL circuit incorporated.

The comparison frequency divider 630 is a frequency divider used at the time of normal operation and divides the frequency of the oscillation output fo of the VCO 620 depending on a predetermined frequency dividing number (1/N1) to supply the selector 632 with the output. The frequency dividing number (1/N1) of the comparison frequency divider 630 is set depending on a frequency (hereinafter, reference frequency f1) required for the oscillation output fo of the VCO 620.

The comparison frequency divider 631 is a frequency divider used when frequency modulation is performed for the oscillation output fo of the VCO 620 and divides the frequency of the oscillation output fo of the VCO 620 depending on a predetermined frequency dividing number (1/N2) to supply the selector 632 with the output. The frequency dividing number (1/N2) of the comparison frequency divider 631 is set depending on a frequency (hereinafter, spread frequency f2) after the oscillation frequency modulation of the oscillation output fo of the VCO 620.

The selector 632 selects either the output of the comparison frequency dividers 630 or the output of the comparison frequency dividers 631 based on a switching signal SEL to supply the phase comparator 640 with a comparison signal fv. The phase comparator 640 compare phases of the comparison signal fv supplied from the selector 632 and the reference signal fr.

It is assumed that the selector 632 selects the output of the comparison frequency dividers 630.

When the phase of the reference signal fr precedes the phase of the comparison signal fv, the phase comparator 640 supplies the charge pump 650 with a phase difference signal $\Phi r$ corresponding to the phase difference. Contrary, when the phase of the reference signal fr falls behind the phase of the comparison signal fv, the phase comparator 640 supplies the charge pump 650 with a phase difference signal $\Phi v$ corresponding to the phase difference.

The charge pump 650 supplies the LPF 660 with a voltage signal CP having a level corresponding to the phase difference signals $\Phi r$, $\Phi v$. The LPF 660 removes harmonic components from the voltage signal CP and supplies the VCO 620 with a direct-current voltage Vr acquired by forming a direct current from the voltage signal CP.

As a result, if the direct-current voltage Vr corresponding to the phase difference signals $\Phi r$ is supplied, the VCO 620 operates such that the oscillation frequency is increased to advance the phase of the comparison signal fv. Contrary, if the direct-current voltage Vr corresponding to the phase difference signals $\Phi v$ is supplied, the VCO 620 operates such that the oscillation frequency is decreased to delay the phase of the comparison signal fv. Finally, the phase difference is not generated between the reference signal fr and the comparison signal fv, and the oscillation frequency of the oscillation output fo of the VCO 620 is locked to the reference frequency f1 (lock state).

By the way, the power spectrum correlated with the oscillation frequency of the output fo of the VCO 620 normally generates a peak at the reference signal f1 in the phase lock state. Therefore, the PLL circuit performs the oscillation frequency modulation of the oscillation output fo of the VCO 620 to spread the power spectrum at the reference signal f1.

If the frequency modulation is performed, the selector 632 selects the output of the comparison frequency dividers 631 and the phase lock state is temporarily released. The PLL circuit performs similar PLL control to lock the phases of the reference signal fr and the output of the comparison frequency dividers 631. As a result, although the oscillation frequency of the oscillation output fo of the VCO 620 departs from the reference frequency f1 and temporarily becomes unsteady state (unlock state), the oscillation frequency is finally locked to the spread frequency f2.

As a result of repeating the operation described above, the power spectrum of the oscillation output fo of the VCO 620 spreads in a bandwidth (spectrum width) between the reference frequency f1 and the spread frequency f2 rather than concentrating on the reference frequency f1 and, therefore, the peak level of the power spectrum is attenuated at the reference frequency f1. Therefore, the EMI noise based on the oscillation output fo of the VCO 620 is reduced.

By the way, if timing of the switch-over is inadequate for the frequency dividing ratio of the comparison comparator, the bandwidth becomes unsteady between the reference frequency and the spread frequency, and the desired effect cannot be acquired from the spread power spectrum. For example, as shown in FIG. 7, if the frequency dividing ratio switch-over timing falls behind the optimum timing, the waveform of the power spectrum has two peaks at the reference frequency f1 and the reference frequency f2. Therefore, to set the optimum frequency dividing ratio switch-over timing, complicated adjustment must be performed to optimize the loop time constant of the PLL circuit, etc., and the PLL circuit must be disposed with a complicated mechanism for setting the frequency dividing ratio switch-over timing.

SUMMARY OF THE INVENTION

In order to solve the above problems, according to a major aspect of the present invention there is provided a PLL circuit comprising an oscillation circuit that generates an oscillation signal with an oscillation frequency based on a supplied voltage; a frequency divider that divides the frequency of the generated oscillation signal based on a predetermined frequency dividing number to generate a comparison signal; a phase comparator that generates a phase difference signal indicative of a phase difference between the generated comparison signal and a reference signal; a low-pass filter that generates a voltage signal formed as a direct current from the generated phase difference signal and that supplies the voltage signal to the oscillation circuit; a controlling unit that switches at a predetermined timing to enable/disable the phase difference signal supplied from the phase comparator to the low pass filter; and a resistor element that is disposed between a predetermined potential and a signal line for supplying the phase difference signal from the phase comparator to the lowpass filter, when the phase difference signal is enabled, the oscillation circuit performing oscillation operation based on the voltage signal corresponding to the phase difference signal, when the phase difference signal is disabled, the low pass filter being supplied with the predetermined potential through the resistor element to allow the oscillation circuit to perform oscillation operation based on the voltage signal generated depending on the supplied predetermined potential.

The other features of the present invention will become apparent from the accompanying drawings and descriptions in this specification.

BRIEF DESCRIPTION OF DRAWINGS

To understand the present invention and the advantages thereof more thoroughly, the following description should be referenced along with the accompanying drawings.

DETAILED DESCRIPTION OF THE INVENTION

From the contents of the description and the accompanying drawings, at least the following details will be apparent.

<Information Processing Apparatus>

Figure 1:
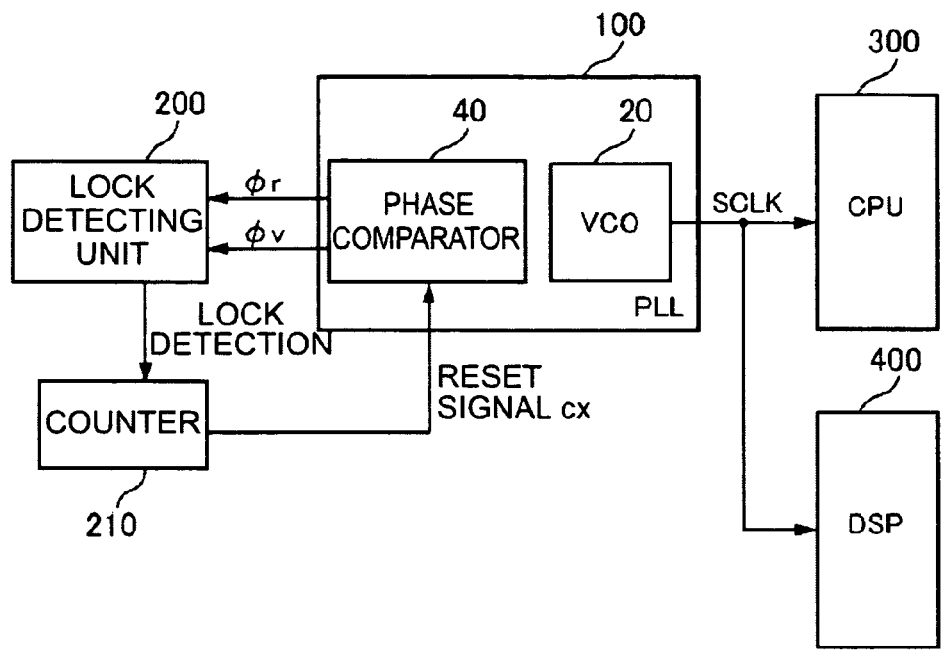
FIG. 1 is a schematic configuration diagram of a system disposed with a PLL circuit according to one embodiment of the present invention.

FIG. 1 is a system configuration diagram of an information processing apparatus disposed with a PLL circuit according to an embodiment of the present invention. The information processing apparatus is an electronic device disposed with the PLL circuit according to the present invention, such as a television receiver, an FM receiver, and a mobile communication device.

The information processing apparatus is disposed with a CPU 300 responsible for overall control of the system and a DSP (Digital Signal Processor) 400 for performing a predetermined digital signal process. A PLL circuit 100 is disposed to synchronize the CPU 300 and the DSP 400 and supplies the CPU 300 and the DSP 400 with a system clock signal SCLK, which is an oscillation output of a voltage controlled oscillation circuit (hereinafter, VCO) 20.

The information processing apparatus employs a spread spectrum technology for the PLL circuit 100 to reduce the EMI noise generated in the PLL circuit 100, such as switching noise of a circuit element based on the system clock signal SCLK output from the VCO 20. A lock detecting unit 200 and a counter 210 are disposed as a mechanism for realizing the spread spectrum technology.

The lock detecting unit 200 detects whether the PLL circuit 100 is in a phase lock state based on phase difference signals (Φr, Φv) indicating a result of phase comparison in a phase comparator 40. If the phase lock state is detected, the lock detecting unit 200 supplies the counter 210 with a lock detection signal.

When the lock detection signal is supplied from the lock detecting unit 200, the counter 210 resets a count value and starts counter operation based on a predetermined clock signal. The counter 210 supplies the phase comparator 40 with a reset signal CX for disabling the phase difference signal.

The reset signal CX is enabled until the counter 210 counts the specified number of times, and the reset signal CX is canceled when the counter 210 counts the specified number of times. In this description, a "reset time" means a time period after the phase comparator 40 is supplied with the reset signal CX in the phase lock state until the reset signal CX is canceled.

When the phase comparator 40 is supplied with the reset signal CX, the PLL circuit 100 performs frequency modulation of the present invention as described later and the oscillation frequency of the VCO 20 fluctuates. After the reset signal CX is canceled, the phase lock state is achieved again and the lock detecting unit 200 supplies the counter 210 with the lock detecting signal to reset the count value of the counter 210 and restart the count operation.

<PLL Circuit>

Figure 2:
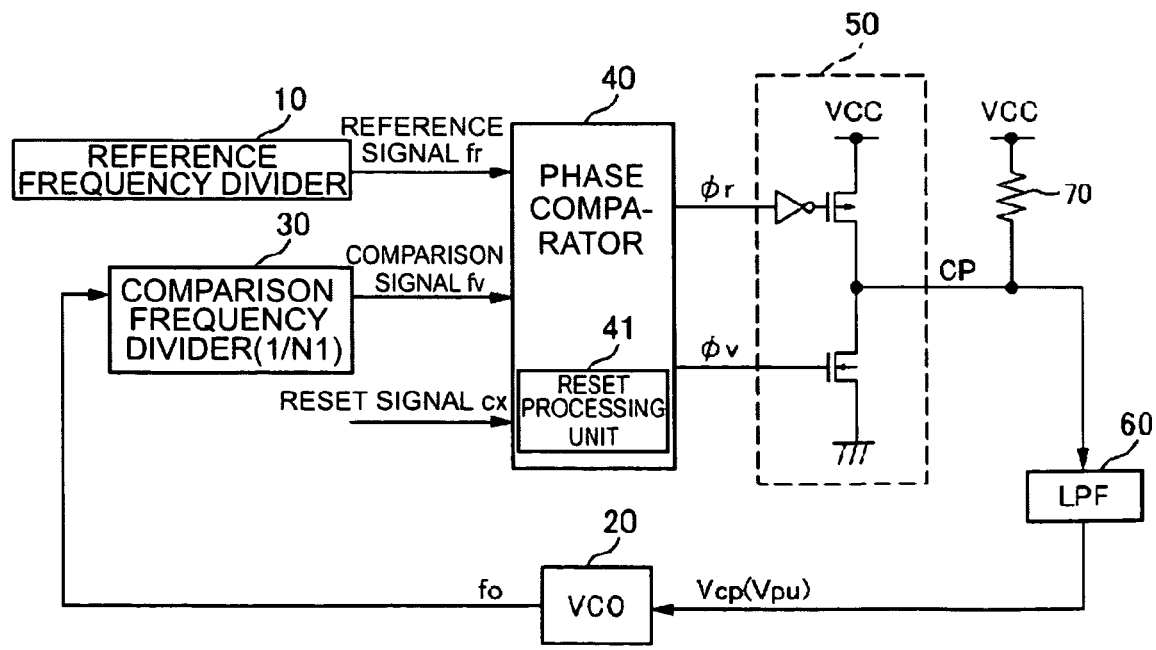
FIG. 2 is a configuration diagram of the PLL circuit according to one embodiment of the present invention.
Figure 3:
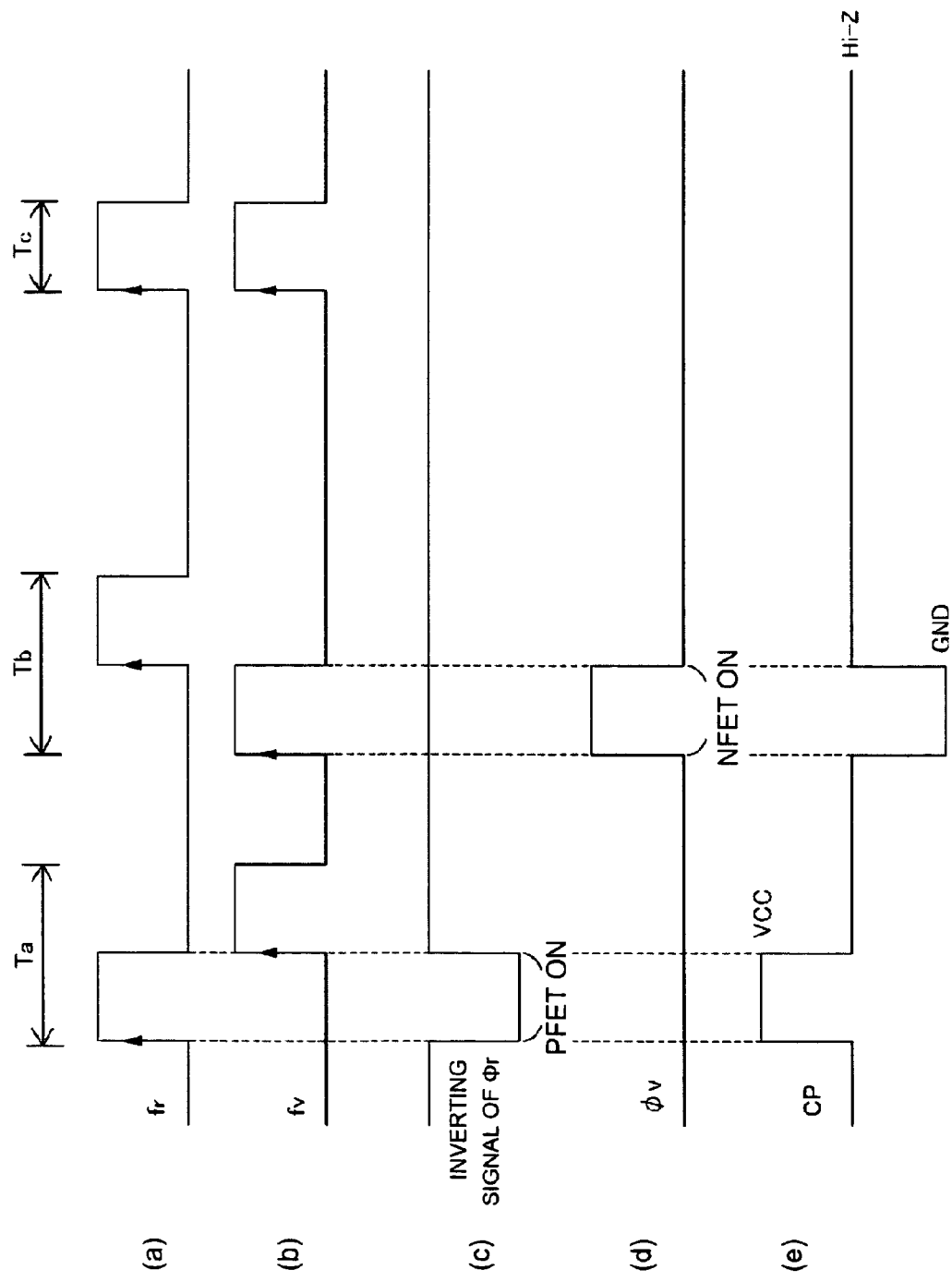
FIG. 3 is a timing chart describing the operation of the PLL circuit according to one embodiment of the present invention.

Description will be made of a configuration and operation of the PLL circuit 100 employing the spread spectrum technology according to one embodiment of the present invention with reference to a circuit diagram of FIG. 2 and a timing chart of FIG. 3.

The PLL circuit includes a reference frequency divider 10, a voltage controlled oscillator (hereinafter, VCO) 20, a comparison frequency divider 30, a phase comparator 40, a charge pump 50, a low-pass filter (hereinafter, LPF) 60, and a pull-up resistor 70. The PLL circuit 100 is integrated except the LPF 60, and the LPF is externally attached.

First, description will be made of the case that the reset signal CX is not supplied from the counter 210 to the phase comparator 40 (at the time of normal operation).

The reference frequency divider 10 is a frequency divider that divides a frequency of an oscillation clock signal (hereinafter, oscillation CLK) depending on a predetermined frequency dividing number to supply the phase comparator 40 with a reference signal fr. The oscillation CLK may be supplied by self-excited oscillation in an oscillation circuit such as a crystal oscillator or may be supplied externally by separately-excited oscillation.

The VCO 20 controls an oscillation frequency depending on a level of an applied voltage and the application time. Generally, a variable-capacitance diode is employed, which has an electric capacitance varying depending on a bias voltage. An oscillation output fo of the VCO 20 is used as a system clock signal SCLK of the information processing apparatus.

The comparison frequency divider 30 is a frequency divider for dividing the frequency of the oscillation output fo of the VCO 20 depending on a predetermined frequency dividing number (1/N1) to supply the phase comparator 40 with a comparison signal fv. The frequency dividing number (1/N1) of the comparison frequency divider 30 is set depending on an oscillation frequency (hereinafter, reference frequency f1) required for the oscillation output fo of the VCO 20. The comparison frequency divider 30 may be a fixed frequency divider with a fixed frequency dividing number or may be a programmable frequency divider with a frequency dividing number that can be set arbitrarily.

In the case of the normal operation, the phase comparator 40 compares the phases of the reference signal fr and comparison signal fv. When the phase of the reference signal fr precedes the phase of the comparison signal fv (see a period Ta of FIGS. 3(a) and 3(b)), the phase comparator 40 supplies the charge pump 50 with a phase difference signal $\Phi r$ corresponding to the phase difference (see the period Ta of FIG. 3(c)). Contrary, when the phase of the reference signal fr falls behind the phase of the comparison signal fv (see a period Tb of FIGS. 3(a) and 3(b)), the phase comparator 40 supplies the charge pump 50 with a phase difference signal $\Phi v$ corresponding to the phase difference (see the period Tb of FIG. 3(d)). That is, at the time of the normal operation, the phase difference signals $\Phi r$, $\Phi v$ are enabled.

The charge pump 50 includes a PMOSFET and an NMOSFET connected serially between a power supply voltage VCC and ground GND. The gate electrode of the PMOSFET is supplied with an inverting signal of the phase difference signal $\Phi r$ and the gate electrode of the NMOSFET is supplied with the phase difference signal $\Phi v$. The LPF 60 is supplied with a voltage signal CP generated at a connection point of the PMOSFET and the NMOSFET.

In the charge pump 50, if both the phase difference signal $\Phi r$ and the phase difference signal $\Phi v$ are L-level, both the PMOSFET and the NMOSFET are turned off and the output (the connection point of the PMOSFET and the NMOSFET) shows high impedance.

If the phase difference signal $\Phi r$ is H-level and the phase difference signal $\Phi v$ is L-level, since the PMOSFET is turned on and the NMOSFET is turned off, the voltage signal CP corresponding to the power supply voltage VCC is output (see the period Ta of FIG. 3(e)). On the other hand, if the phase difference signal $\Phi r$ is L-level and the phase difference signal $\Phi v$ is H-level, since the PMOSFET is turned off and the NMOSFET is turned on, the voltage signal CP corresponding to the ground GND is output (see the period Tb of FIG. 3(e)).

If the phase difference signals $\Phi r$, $\Phi v$ are enabled, the LPF 60 is supplied with the voltage signal CP based on the phase difference signals $\Phi r$, $\Phi v$ from the charge pump 50. The LPF 60 removes harmonic components from the voltage signal CP and supplies the VCO 20 with a direct-current voltage Vc acquired by forming a direct current from the voltage signal CP.

If a direct-current voltage Vcp corresponding to the phase difference signal $\Phi r$ is supplied, the VCO 20 operates such that the oscillation frequency is increased to advance the phase of the comparison signal fv. Contrary, if the direct-current voltage Vcp corresponding to the phase difference signals $\Phi v$ is supplied, the VCO 20 operates such that the oscillation frequency is decreased to delay the phase of the comparison signal fv. As a result, finally, the phase difference is not generated between the reference signal fr and the comparison signal fv, and the oscillation frequency of the VCO 20 is locked to the reference frequency f1 (phase lock state).

Description will then be made of the case that the reset signal CX is supplied from the counter 210 to the phase comparator 40 when the phase lock state is detected by the lock detecting unit 200 (at the time of frequency modulation operation).

The phase comparator 40 includes a reset processing unit 41 ("controlling unit"). The reset processing unit 41 enables the phase difference signals $\Phi r$, $\Phi v$ in the case of the normal operation and disables the phase difference signals $\Phi r$, $\Phi v$ if the phase comparator 40 is supplied with the reset signal CX. Disabling the phase difference signal $\Phi r$, $\Phi v$ means that the level of the phase difference signal $\Phi r$, $\Phi v$ is converted forcibly to the level (L-level) for setting the output of the charge pump 50 to high impedance. The reset processing unit 41 may be disposed outside of the phase comparator 40.

If the output of the charge pump 50 is set to high impedance, the LPF 60 is supplied with a pull-up voltage VCC through a pull-up resistor 70 disposed between a signal line supplying the voltage signal CP from the charge pump 50 to the LPF 60 and the power supply voltage VCC (when ignoring the voltage drop of the pull-up resistor 70). Similarly, the LPF 60 removes harmonic components from the pull-up voltage VCC and supplies the VCO 20 with a direct-current voltage Vpu acquired by forming a direct current from the pull-up voltage VCC.

When the direct-current voltage Vpu corresponding to the pull-up voltage VCC is supplied, the VCO 20 operates such that the oscillation frequency is increased depending on the time period during the direct-current voltage Vpu is supplied, i.e., the reset time, until the reset signal CX is cancelled based on the counter 210. When the reset signal CX is subsequently cancelled, the reset processing unit 41 enables the phase difference signals $\Phi r$, $\Phi v$ again, and the VCO 20 is supplied with the direct-current voltage Vcp corresponding to the phase difference signal $\Phi r$ or the phase difference signal $\Phi v$. The normal PLL operation is performed as described above to lock the oscillation frequency of the VCO 20 to the reference frequency f1.

By repeating the normal operation and the frequency modulation operation based on the reset signal CX in this way, the power spectrum of the oscillation output fo of the VCO 20 spreads from the reference frequency f1 in the high-frequency direction rather than concentrating on the reference frequency f1 and, therefore, the peak level of the power spectrum is attenuated at the reference frequency f1. Therefore, the EMI noise based on the oscillation output of the VCO 20 is reduced.

Unlike the conventional case, with regard to the oscillation frequency of the output fo of the VCO 20, the oscillation frequency is increased continuously depending on as the reset time advances. Therefore, unlike the conventional case, the power spectrum does not concentrate on a certain frequency (spread frequency) after the frequency conversion. Therefore, the effect of decreasing the EMI noise can be further improved by only adding simple mechanisms such as a mechanism that disables the phase difference signals Φr, Φv (the reset processing unit 41) and the pull-up resistor 70.

<Effect of Spread Spectrum Corresponding to Resistance Values>

Figure 4:
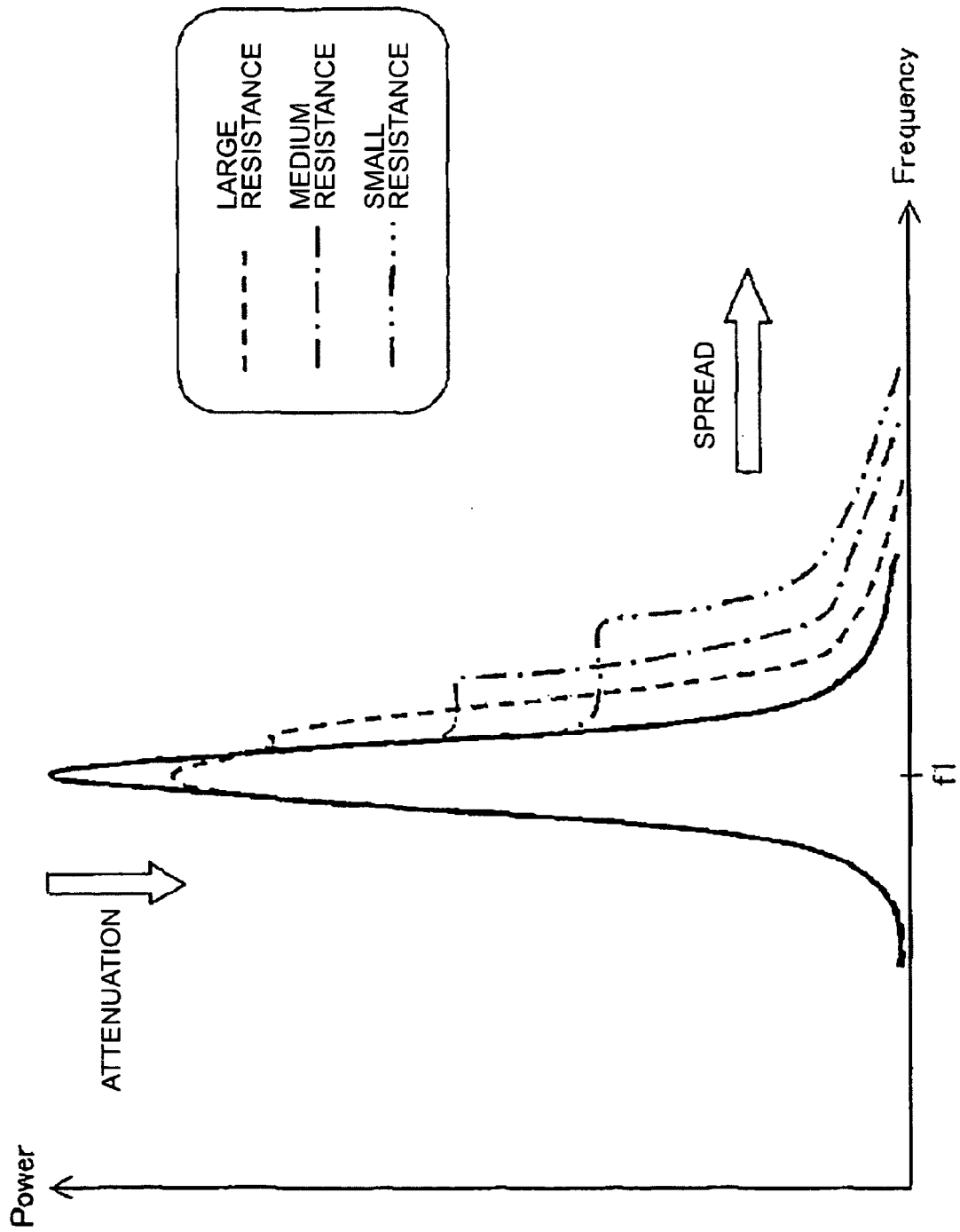
FIG. 4 shows power spectrum waveforms corresponding to resistance values according to one embodiment of the present invention.

FIG. 4 is a diagram describing changes in the power spectrum waveform corresponding to resistance values of the pull-up resistor 70 when the reset time is constant. The power spectrum is a level (power) of each signal frequency component appearing on a time axis, which is represented with a frequency axis versus a power axis. The level of the power spectrum is generally obtained as the magnitude of the Fourier coefficient (coefficient of Sin and Cos) when the Fourier series expansion is performed based on the sampling data of the signal level on the time axis.

The power spectrum waveform shown by a solid line of FIG. 4 shows the case that the PLL circuit 100 performs the normal PLL operation. Since the oscillation frequency of the VCO 20 is concentrated on the reference frequency f1 due to the PLL operation, the power spectrum has a peak level at the reference frequency f1.

Power spectrum wave forms shown by a dashed line, dot-and-dash line, and double-dot-and-dash line of FIG. 4 show the cases of performing the frequency modulation of the oscillation frequency (reference frequency f1) at the time of the phase lock of the VCO 20 based on the reset signal CX. Under the condition that the reset time is constant, the resistance value of the pull-up resistor 70 is decreased in the order of the dashed line, dot-and-dash line, and double-dot-and-dash line.

As shown in FIG. 4, the peak level of the power spectrum at the time of the frequency modulation is more attenuated than the peak level of the power spectrum at the time of the PLL normal operation, regardless of the resistant value of the pull-up resistor 70. Since the reset time is constant, the attenuation amount of the peak level of the power spectrum is not changed by the change in the resistant value of the pull-up resistor 70.

On the other hand, if the resistant value of the pull-up resistor 70 is small, the voltage drop in the pull-up resistor 70 is reduces as compared to the case of the large resistance value of the pull-up resistor 70 and, therefore, the level of the direct-current voltage Vpu supplied to the VCO 20 is increased. Therefore, since the oscillation frequency of the VCO 20 is changed in the higher-frequency direction, the spectrum width is expanded and the power spectrum is spread more broadly.

By setting the resistance value of the pull-up resistor 70 depending on the extent of spreading the power spectrum in this way, the effect of spreading the power spectrum can be further improved.

<Effect of Spread Spectrum Corresponding to Reset Time>

Figure 5:
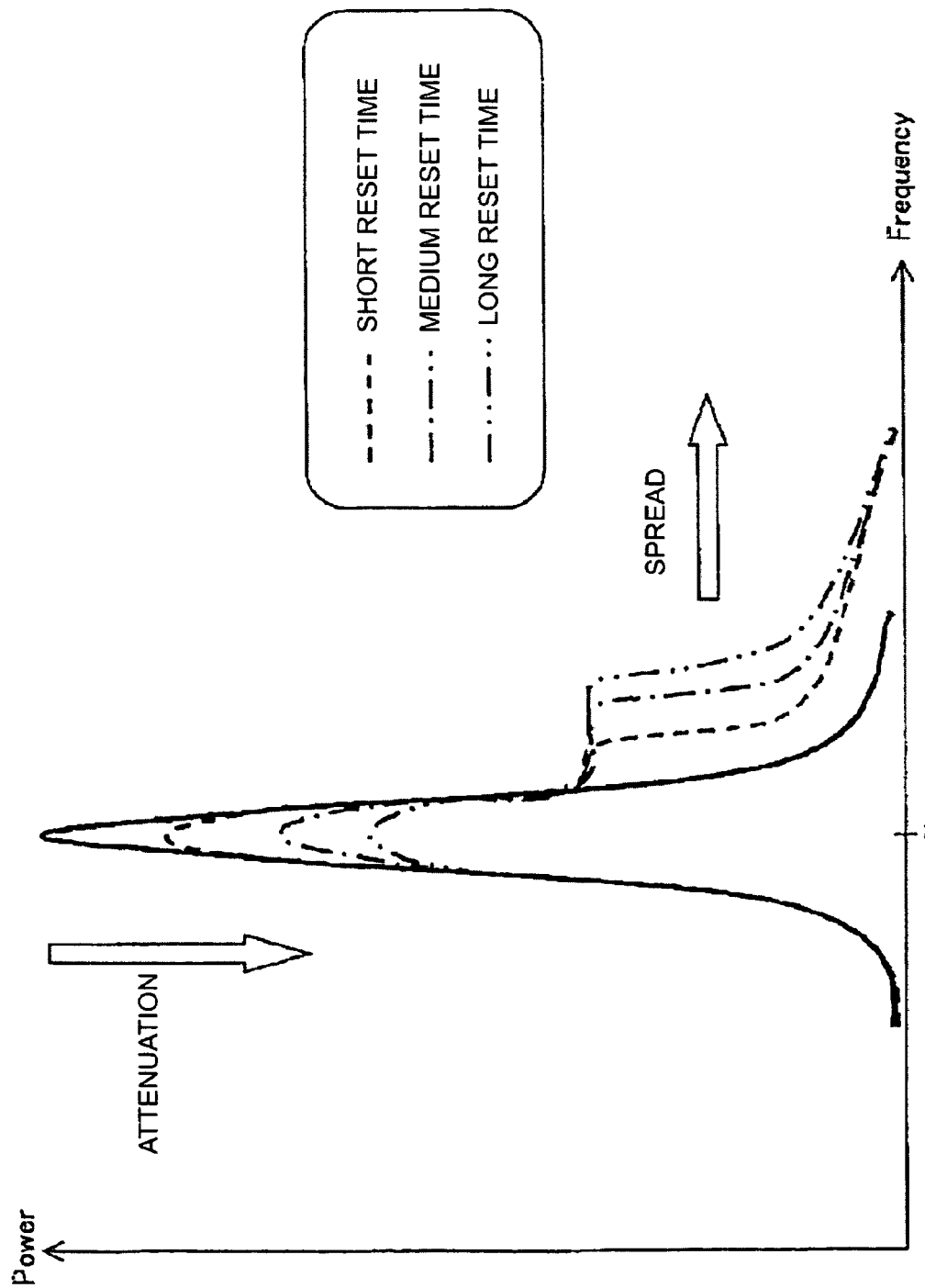
FIG. 5 shows power spectrum waveforms corresponding to reset periods according to one embodiment of the present invention.
Figure 6:
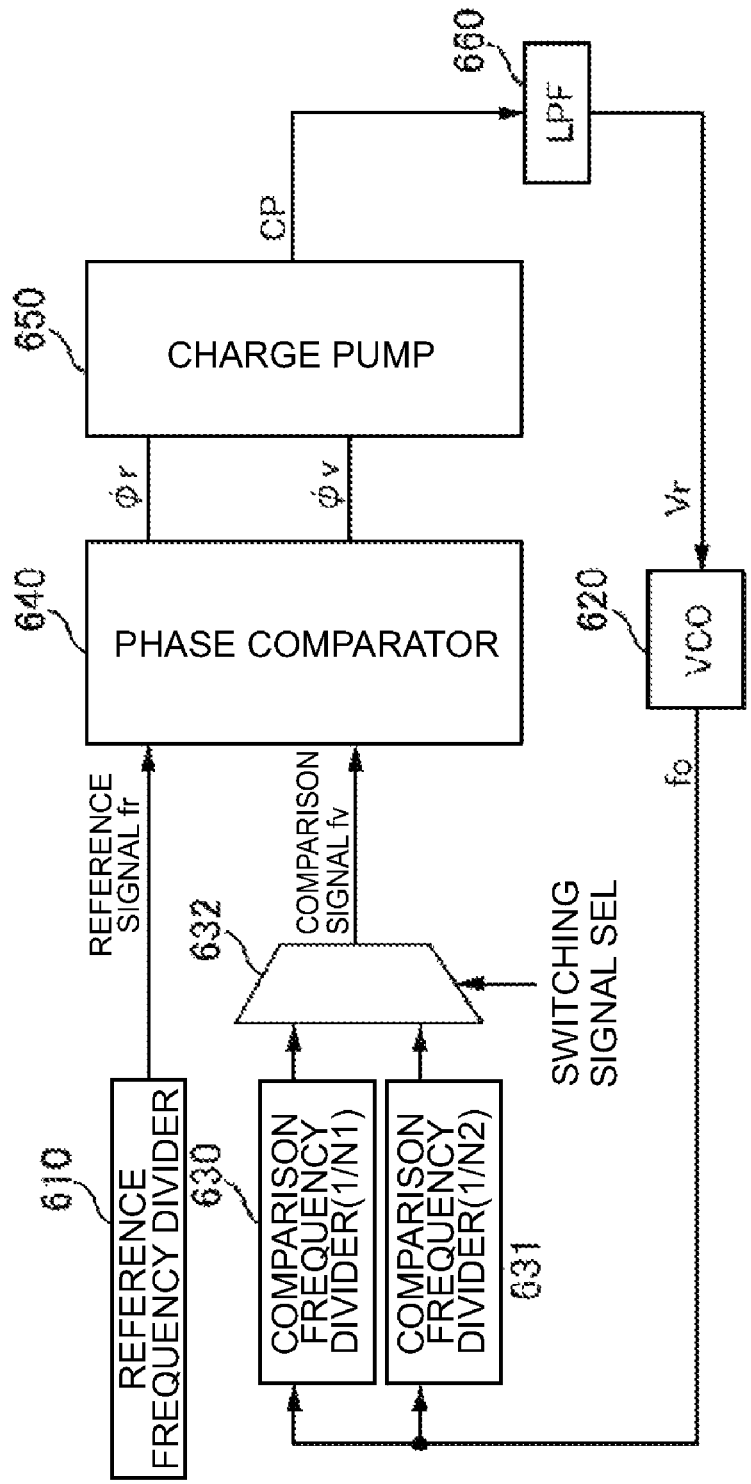
FIG. 6 is a configuration diagram of a conventional PLL circuit.
Figure 7:
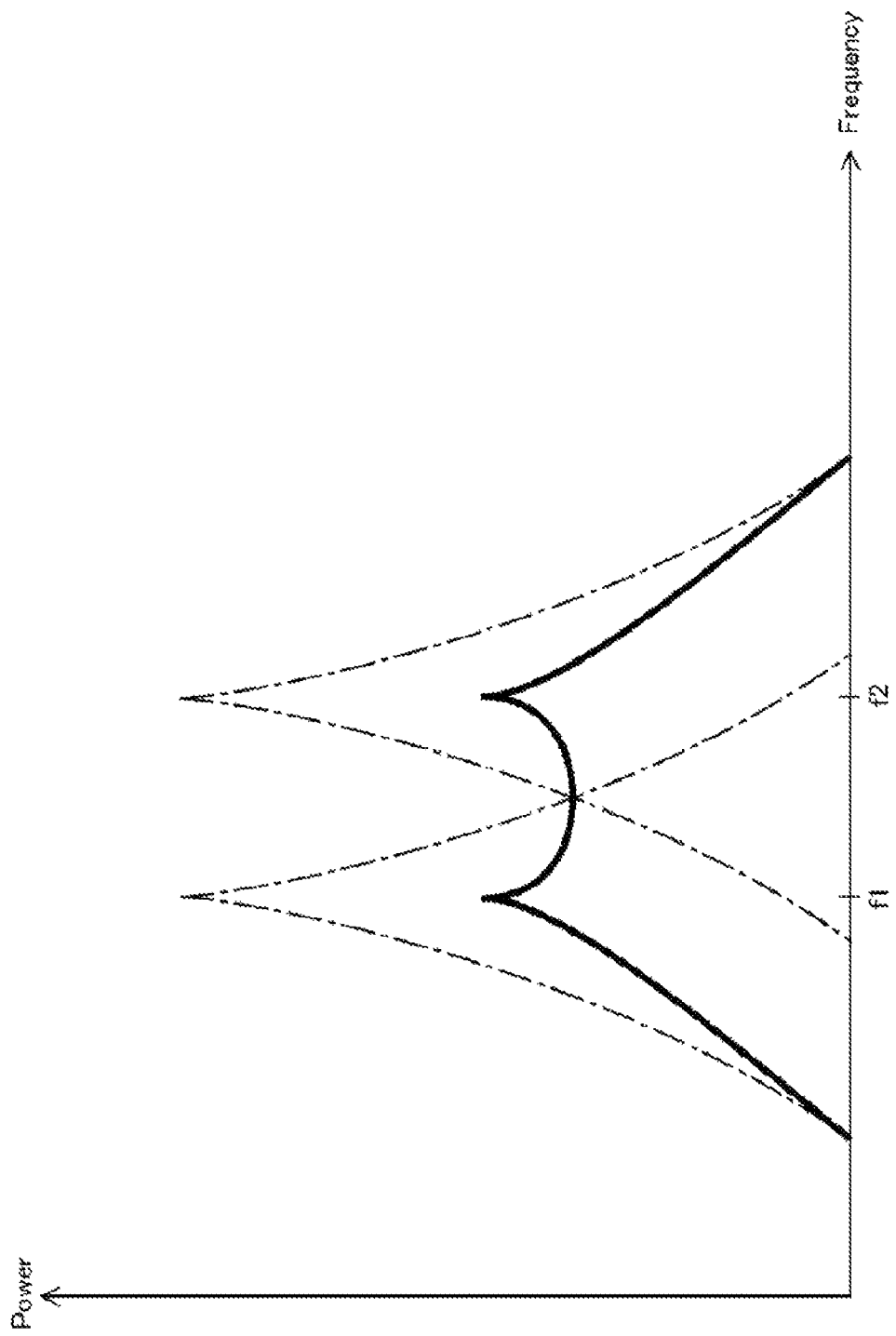
FIG. 7 shows a conventional power spectrum waveform.

FIG. 5 is a diagram describing changes in the power spectrum waveform corresponding to the length of the reset time when the resistance value of the pull-up resistor 70 is constant.

The power spectrum waveform shown by a solid line of FIG. 5 shows the case that the PLL circuit 100 performs the normal PLL operation. Since the oscillation frequency of the VCO 20 is concentrated on the reference frequency f1 due to the PLL operation, the power spectrum has a peak level at the reference frequency f1.

Power spectrum wave forms shown by a dashed line, dot-and-dash line, and double-dot-and-dash line of FIG. 5 show the cases of performing the frequency modulation of the oscillation frequency (reference frequency f1) at the time of the phase lock of the VCO 20 based on the reset signal CX. Under the condition that the resistance value of the pull-up resistor 70 is constant, the reset time is increased in the order of the dashed line, dot-and-dash line, and double-dot-and-dash line.

As shown in FIG. 5, the peak level of the power spectrum at the time of the frequency modulation is more attenuated than the peak level of the power spectrum at the time of the PLL normal operation. Since the power spectrum is away from the reference frequency f1 for a longer time as the reset time is increased, the attenuation amount of the peak level of the power spectrum is increased. Since the oscillation frequency of the VCO 20 changes to a higher frequency as the reset time is increased, the spectrum width is expanded and the power spectrum is spread more broadly.

By setting the reset time depending on the extent of the attenuation of the peak level of the power spectrum or the extent of spreading the power spectrum in this way, the effect of spreading the power spectrum can be further improved. It is needless to say that the effect of spreading the power spectrum is further improved by setting the resistance value of the aforementioned pull-up resistor 70 to an appropriate value in combination with the setting of the length of the reset time.

Although detailed description has been made of the illustrative and presently preferred embodiment of the present invention, the concept of the present invention can be changed variously for implementation and application, and the range of the appended claims encompasses various modifications except insofar as limited by the prior art.

For example, the charge pump 50 may not be disposed due to the configuration of the PLL circuit in the embodiment described above. In this case, for example, the serially connected PMOSFET and NMOSFET similar to the charge pump 50 are disposed on the output stage of the phase comparator 40 to output the phase difference signal corresponding to the voltage signal CP described above. When the reset signal CX is supplied, the reset processing unit 41 performs control such that both the PMOSFET and the NMOSFET on the output stage of the phase comparator 40 are turned off to set the output level of the phase comparator 40 to high impedance.

In the above embodiment, instead of the pull-up resistor 70, a pull-down resistor may be employed and disposed between the ground GND and the signal line between the charge pump 50 and the LPF 60. If the pull-down resistor is employed, when the frequency modulation is performed for the oscillation frequency (reference frequency f1) at the time of the phase lock of the VCO 20 based on the reset signal CX, the level of the direct-current voltage Vpu supplied to the VCO 20 is L-level. Therefore, the oscillation frequency of the VCO 20 changes in the lower-frequency direction and the effect of spreading the power spectrum can be acquired as is the case with the pull-up resistor 70.

What is claimed is:
1. A PLL circuit comprising:
an oscillation circuit that generates an oscillation signal with an oscillation frequency based on a supplied voltage;
a frequency divider that divides the frequency of the oscillation signal based on a predetermined frequency dividing number to generate a comparison signal;

a phase comparator configured to generate a phase difference signal indicative of a phase difference between the generated comparison signal and a reference signal;

a low-pass filter that generates a voltage signal formed as a direct current from the phase difference signal and that supplies the voltage signal to the oscillation circuit;

a controlling unit that causes spreading of a power spectrum of the oscillation signal by switching, at a predetermined timing, the phase comparator between a first state where the phase difference signal is output from the phase comparator and a second state where the phase difference signal is disabled and not output from the phase comparator; and a resistor element that is disposed between a predetermined potential and a signal line for supplying the phase difference signal from the phase comparator to the low pass filter, when the phase difference signal is output from the phase comparator, the oscillation circuit performing oscillation operation based on the voltage signal corresponding to the phase difference signal, when the phase difference signal is disabled, the low pass filter being supplied with the predetermined potential through the resistor element to allow the oscillation circuit to perform oscillation operation based on the voltage signal generated depending on the supplied predetermined potential.

2. The PLL circuit of claim 1, wherein the phase comparator includes a charge pump to output the phase difference signal to the low-pass filter, and wherein when the phase comparator is switched to the second state to disable the phase difference signal, the controlling unit performs control to set an output level of the charge pump to high impedance.

3. The PLL circuit of claim 1, wherein the resistance value of the resistor element is set depending on the extent of spreading the power spectrum of the oscillation signal.

4. The PLL circuit of claim 1, wherein the period for which the phase difference signal is disabled is set depending on the extent of attenuating the peak level of the power spectrum of the oscillation signal.

5. The PLL circuit of claim 1, wherein the period for which the phase difference signal is disabled is set depending on the extent of spreading the power spectrum of the oscillation signal.

* * * * *